United States Patent
Obradovic et al.

(10) Patent No.: US 9,960,232 B2
(45) Date of Patent: May 1, 2018

(54) HORIZONTAL NANOSHEET FETS AND METHODS OF MANUFACTURING THE SAME

(71) Applicant: Samsung Electronics Co., Ltd., Suwon-si, Gyeonggi-do (KR)

(72) Inventors: Borna Obradovic, Leander, TX (US); Titash Rakshit, Austin, TX (US); Mark Rodder, Dallas, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days. days.

(21) Appl. No.: 15/340,775

(22) Filed: Nov. 1, 2016

(65) Prior Publication Data

US 2017/0323941 A1 Nov. 9, 2017

Related U.S. Application Data (60) Provisional application No. 62/340,998, filed on May 24, 2016, provisional application No. 62/333,763, filed on May 9, 2016.

(51) Int. Cl.
*H01L 29/00* (2006.01)
*H01L 29/06* (2006.01)
(Continued)

(52) U.S. Cl.
CPC .... *H01L 29/0665* (2013.01); *H01L 21/30612* (2013.01); *H01L 29/0847* (2013.01); *H01L 29/1033* (2013.01); *H01L 29/20* (2013.01); *H01L 29/41758* (2013.01); *H01L 29/42392* (2013.01); *H01L 29/6656* (2013.01); *H01L 29/66522* (2013.01); *H01L 29/66545* (2013.01); *H01L 29/66553* (2013.01); *H01L 29/66742* (2013.01); *H01L 29/78621* (2013.01); *H01L 29/78681* (2013.01)

(58) Field of Classification Search
None
See application file for complete search history.

(56) References Cited

U.S. PATENT DOCUMENTS

8,969,931 B2   3/2015  Bjoerk et al.
9,324,812 B2   4/2016  Yang et al.
(Continued)

*Primary Examiner* — Evren Seven
(74) *Attorney, Agent, or Firm* — Lewis Roca Rothgerber Christie LLP (57) ABSTRACT

A horizontal nanosheet field effect transistor (hNS FET) including source and drain electrodes, a gate electrode between the source and drain electrodes, a first spacer separating the source electrode from the gate electrode, a second spacer separating the drain electrode from the gate electrode, and a channel region under the gate electrode and extending between the source electrode and the drain electrode. The source electrode and the drain electrode each include an extension region. The extension region of the source electrode is under at least a portion of the first spacer and the extension region of the drain electrode is under at least a portion of the second spacer. The hNS FET also includes at least one layer of crystalline barrier material having a first thickness at the extension regions of the source and drain electrodes and a second thickness less than the first thickness at the channel region.

13 Claims, 10 Drawing Sheets

(51) Int. Cl.
*H01L 29/417* (2006.01)
*H01L 29/08* (2006.01)
*H01L 29/20* (2006.01)
*H01L 29/10* (2006.01)
*H01L 29/786* (2006.01)
*H01L 29/66* (2006.01)
*H01L 21/306* (2006.01)
*H01L 29/423* (2006.01)

(56) References Cited

U.S. PATENT DOCUMENTS

| | | | | |
|---|---|---|---|---|
| 2013/0341704 | A1* | 12/2013 | Rachmady | H01L 29/66545 257/327 |
| 2014/0084246 | A1* | 3/2014 | Pillarisetty | H01L 29/775 257/24 |
| 2014/0225065 | A1* | 8/2014 | Rachmady | H01L 29/42392 257/24 |
| 2015/0123215 | A1* | 5/2015 | Obradovic | H01L 29/42392 257/410 |
| 2015/0228782 | A1* | 8/2015 | Lin | H01L 29/785 257/24 |
| 2015/0295084 | A1* | 10/2015 | Obradovic | H01L 29/7845 257/347 |
| 2016/0020305 | A1* | 1/2016 | Obradovic | H01L 29/7391 257/39 |
| 2016/0027929 | A1* | 1/2016 | Cheng | H01L 29/78696 257/9 |
| 2016/0172358 | A1* | 6/2016 | Hatcher | H01L 29/42392 257/401 |
| 2017/0271474 | A1* | 9/2017 | Obradovic | H01L 27/088 |

* cited by examiner

HORIZONTAL NANOSHEET FETS AND METHODS OF MANUFACTURING THE SAME

CROSS-REFERENCE TO RELATED APPLICATIONS

The present application claims priority to and the benefit of U.S. Provisional Application No. 62/340998, filed on May 24, 2016, and U.S. Provisional Application No. 62/333,763, filed May 9, 2016, the entire contents of both of which are incorporated herein by reference.

BACKGROUND

Horizontal nanosheet (hNS) field effect transistors (FETs) having InGaAs channels offer the possibility of high mobility, high injection velocity, and low gate capacitance. However, InGaAs hNS FETs also tend to have small bandgaps, such as approximately 750 meV or even less than 1.1 eV for silicon. A consequence of this small direct bandgap is a large amount of band-to-band tunneling (BTBT) leakage current, which is further exacerbated by the parasitic bipolar effect (PBE) that is present in all gate-all-around (GAA) FETs. Parasitic leakage, which is a combination of the BTBT leakage and PBE gain, is exponentially sensitive to positive supply voltage ($V_{DD}$) and channel length. BTBT occurs in regions of strong band-bending, which exists in the transition region between the channel and the high-doped portion of the drain extension. In related art hNS FETs in which the effective channel length ($L_{eff}$) is approximately equal to the gate length ($L_G$), the hNS FETs have very high BTBT leakage and are unusable for a mobile system on a chip (SOC) operating at supply voltages of 0.75V or higher. Additionally, the channel length sensitivity presents a significant scaling limitation because hNS FETs with an $L_{eff}$ of approximately 15 nm may not be able to operate with $V_{DD}$ above approximately 0.7V without incurring excessive BTBT leakage.

In the related art, this significant scaling limitation may be addressed by configuring the FET such that the $L_{eff}$ is longer than the $L_G$. Increasing $L_{eff}$ by shifting the PN junction away from the gate edges reduces band curvature and exponentially reduces BTBT leakage. Increasing the $L_{eff}$ also reduced PBE gain, which has a near-exponential sensitivity to channel length. The $L_{eff}$ could be increased, for instance, up to two spacer thicknesses larger than the $L_G$. However, in related art hNS FETs, increasing $L_{eff}$ reduces the electron concentration in the extension regions and thus increases parasitic resistance ($R_{para}$). The resulting increase in $R_{para}$ may render the hNS FET unsuitable. Accordingly, in related art hNS FETs, there is a tradeoff between BTBT leakage and $R_{para}$ (e.g., the BTBT leakage of related art hNS FETs may be reduced by increasing the $L_{eff}$, but this reduction in BTBT leakage is at the expense of increasing the $R_{para}$ of the hNS FET).

SUMMARY

The present disclosure is directed to various embodiments of a horizontal nanosheet (hNS) field effect transistor (FET). In one embodiment, the hNS FET includes a source electrode, a drain electrode, a gate electrode between the source electrode and the drain electrode, a first spacer separating the source electrode from the gate electrode, a second spacer separating the drain electrode from the gate electrode, a channel region under the gate electrode extending between the source electrode and the drain electrode, and at least one layer of crystalline barrier material. The source electrode and the drain electrode each include an extension region. The extension region of the source electrode is under at least a portion of the first spacer and the extension region of the drain electrode is under at least a portion of the second spacer. The layer of crystalline barrier material has a first thickness at the extension regions of the source and drain electrodes and a second thickness less than the first thickness at the channel region. The first thickness of the layer of crystalline barrier material at the extension regions of the source and drain electrodes may be from approximately 3 nm to approximately 5 nm and the second thickness of the layer of crystalline barrier material at the channel region may be from approximately 1 nm to approximately 2 nm. The first thickness of the layer of crystalline barrier material at the extension regions of the source and drain electrodes may be from approximately 0.5 nm to approximately 5 nm and the second thickness of the layer of crystalline barrier material at the channel region may be substantially zero. The at least one layer may include a first layer of crystalline barrier material above the extension regions of the source and drain electrodes and a second layer of crystalline barrier material below the extension regions of the source and drain electrodes. The crystalline barrier material may be InP, InGaP, InAlA, AlAsSb, or combinations thereof.

The crystalline barrier material may include a II-IV semiconductor alloy, such as ZnSeTe or ZnCdTe.

Upper portions of the source and drain electrodes may be more heavily doped than remaining portions of the source and drain electrodes. The more heavily doped upper portions of the source and drain electrodes may each have a thickness from approximately 5 nm to approximately 10 nm.

The channel may include a III-V material.

The extension regions of the source and drain electrodes may be lightly doped having a doping density from approximately 5 e18/cm$^3$ to 1 e17/cm$^3$.

An effective length of the channel region may be greater than a length of the gate electrode. The effective length of the channel region may be greater than the length of the gate electrode by at least approximately 4 nm.

The present disclosure is also directed to various methods of manufacturing a horizontal nanosheet field effect transistor. In one embodiment, the method includes forming a sacrificial barrier layer, forming a first layer of crystalline barrier material on the sacrificial barrier layer, forming a channel layer on the first layer of crystalline barrier material, forming a second layer of crystalline barrier material on the channel layer, forming a sacrificial gate, forming a pair of spacers, wherein a portion of the channel layer between the pair of spacers defines a channel region, etching to remove portions of the sacrificial barrier layer, the channel layer, and the first and second layers of crystalline barrier material outside of the pair of spacers, epitaxially re-growing a source electrode and a drain electrode, the source electrode and the drain electrode each including an extension region underneath one spacer of the pair of spacers, etching to remove the sacrificial gate and a remainder of the sacrificial barrier layer, etching to remove at least portions of the first and second layers of the crystalline barrier material above and below the channel region such that the first and second layers of the crystalline barrier material at the extension regions of the source and drain electrodes have a first thickness and the first and second layers of the crystalline barrier material at the channel region have a second thickness less than the first thickness, and depositing a gate electrode between the pair of spacers and above the channel region.

Etching to remove at least portions of the first and second layers of the crystalline barrier material above and below the channel region may include completely removing the portions of the first and second layers of the crystalline barrier material above and below the channel region.

The method may also include ultra-shallow doping of upper end portions of the source and drain electrodes.

The extension regions of the source and drain electrodes may be lightly doped having a doping density from approximately 5 e18/cm$^3$ to 1 e17/cm$^3$.

An effective length of the channel region may be greater than a length of the gate electrode.

A method of manufacturing a horizontal nanosheet field effect transistor according to another embodiment of the present disclosure includes obtaining an initial stack including an alternating arrangement of sacrificial crystalline layers and channel layers, forming a source electrode and a drain electrode, etching the initial stack to form regions for internal spacers, epitaxially re-growing at least one layer of crystalline barrier material, the at least one layer of crystalline barrier material having a first thickness at extension regions of the source and drain electrodes and a second thickness less than the first thickness at a channel region, and depositing the internal spacers.

The method may also include depositing a gate electrode between the internal spacers. An effective length of the channel region may be greater than a length of the gate electrode.

This summary is provided to introduce a selection of features and concepts of embodiments of the present disclosure that are further described below in the detailed description. This summary is not intended to identify key or essential features of the claimed subject matter, nor is it intended to be used in limiting the scope of the claimed subject matter. One or more of the described features may be combined with one or more other described features to provide a workable device.

BRIEF DESCRIPTION OF THE DRAWINGS

These and other features and advantages of embodiments of the present disclosure will become more apparent by reference to the following detailed description when considered in conjunction with the following drawings. In the drawings, like reference numerals are used throughout the figures to reference like features and components. The figures are not necessarily drawn to scale.

DETAILED DESCRIPTION

The present disclosure is directed to various embodiments of a horizontal nanosheet (hNS) field effect transistor (FET) and various methods of manufacturing the horizontal nanosheet field effect transistor. The horizontal nanosheet field effect transistor according to one embodiment of the present disclosure includes one or more layers of crystalline barrier material (CBM) at the drain electrode extension region and/or at the source electrode extension region. Additionally, according to one or more embodiments of the present disclosure, the one or more layers of CBM either do not extend to a channel region of the hNS FET or the one or more layers of CBM are thinner at the channel region compared to the source and drain extension regions. The one or more layers of CBM are configured to increase electron mobility in the extension regions of the source and drain electrodes by suppressing surface roughness scattering (SRS), which would otherwise occur at the interface between the crystalline channel and a non-crystalline overlayer. Reducing the thickness of the one or more layers of CBM at the channel region compared to the extension regions, or not providing the one or more layers of CBM in the channel region, is configured to increase electron mobility in the extension regions without increasing the equivalent oxide thickness (EOT) of the hNS FET, which would be detrimental to the short channel effects (SCE) performance of the hNS FET and would not be a practical solution for the 5 nm node and beyond. Additionally, according to one or more embodiments, the extension regions of the source and drain electrodes are lightly doped and the effective length of the channel is greater than the length of the gate. Reducing the doping in the extension regions and increasing the effective length of the channel is configured to reduce the parasitic leakage of the hNS FET. Together, the effective length of the channel, the light doping of the extension regions, and the one or more layers of CBM in the extension regions are configured to reduce the parasitic leakage of the hNS FET while not increasing or substantially not increasing the parasitic resistance of the hNS FET. Accordingly, unlike related art hNS FETs, in the hNS FET of the present disclosure there is not a tradeoff between parasitic leakage and parasitic resistance.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
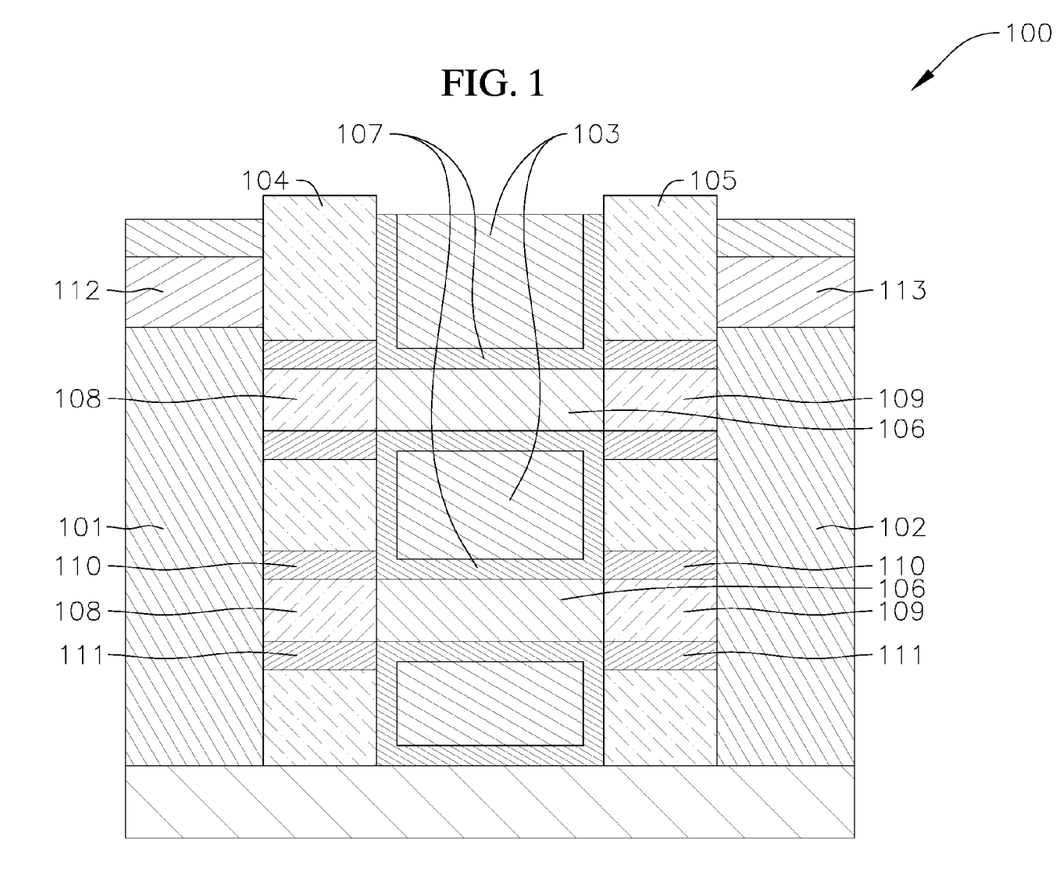
FIG. 1 is a schematic cross-sectional view of a horizontal nanosheet (hNS) field effect transistor (FET) according to one embodiment of the present disclosure.

With reference now to FIG. 1, a horizontal nanosheet (hNS) field effect transistor (FET) 100 according to one embodiment of the present disclosure includes a source electrode 101, a drain electrode 102, a gate electrode 103 between the source electrode 101 and the drain electrode 102, a first spacer 104 between the source electrode 101 and the gate electrode 103, a second spacer 105 between the drain electrode 102 and the gate electrode 103, and a channel region 106 under the gate electrode 103 and extending between the source electrode 101 and the drain electrode 102. The channel region 106 may be formed, for example, of $In_xGa_{1-x}As$ or $In_xGa_{1-x}Sb$. In one or more embodiments, the source and drain electrodes 101, 102 may be formed of a different material than the channel region 106. For example, in one embodiment in which the channel region 106 is formed of $In_xGa_{1-x}As$, the source and drain electrodes 101, 102 may be formed of $In_yGa_{1-y}As$, where y<x. In one or more embodiments, the source and drain electrodes 101, 102 may be formed of InAs. In the illustrated embodiment, the hNS FET 100 also includes a high dielectric (hi-k) interfacial layer 107. The hi-k interfacial layer 107 extends at least partially along the gate electrode 103. In the illustrated embodiment, the hi-k interfacial layer 107 extends along a lower surface and a pair of opposing side surfaces of the gate electrode 103 such that hi-k interfacial layer 107 separates the gate electrode 103 from the channel region 106 and the first and second spacers 104, 105. In the illustrated embodiment, the source electrode 101 includes an extension region 108 extending at least partially under the first spacer 104 and the drain electrode 102 includes an extension region 109 extending at least partially under the second spacer 105.

In the illustrated embodiment, the hNS FET 100 also includes a first layer 110 of crystalline barrier material (CBM) above (e.g., on) the extension regions 108, 109 of the source and drain electrodes 101, 102, respectively, and a second layer 111 of CBM below (e.g., underneath) the extension regions 108, 109 of the source and drain electrodes 101, 102, respectively. Additionally, in the illustrated embodiment, the first and second layers 110, 111 of CBM do not extend over or under the channel region 106 (i.e., the channel region 106 of the hNS FET 100 is free or substantially free of the layers 110, 111 of CBM). In one or more embodiments, the first layer 110 of CBM and/or the second layer 111 of CBM may extend above and/or below the channel region 106, but the portions of the first and/or second layers 110, 111 of the CBM at the channel region 106 have a thickness less than the portions of the first and second layers 110, 111 of CBM at the extension regions 108, 109 of the source and drain electrodes 101, 102, respectively (i.e., the first layer 110 of CBM and/or the second layer 111 of CBM has a reduced thickness at the channel region 106). Additionally, in one or more embodiments, the hNS FET 100 may be provided with a single layer of CBM for each transistor (e.g., the hNS FET may include the first layer 110 of CBM above the extension regions 108, 109 or the second layer 111 of CBM below the extension regions 108, 109). In one embodiment in which the first and second layers 110, 111 of CBM are provided at the extension regions 108, 109 but not at the channel region 106, the first and second layers 110, 111 of CBM may each have a thickness from approximately 0.5 nm to approximately 5 nm, such as, for instance, from approximately 1 nm to approximately 3 nm. In one embodiment in which the first and second layers 110, 111 of CBM are provided at both the extension regions 108, 109 and the channel region 106, the portions of the first and second layers 110, 111 of CBM at the extension regions 108, 109 may each have a thickness from approximately 3 nm to approximately 5 nm and the portions of the first and second layers 110, 111 at the channel region 106 may each have a thickness less than or equal to approximately 2 nm (e.g., a thickness from approximately 1 nm to approximately 2 nm).

In one or more embodiments, the CBM of the first and second layers 110, 111 may be InP, InGaP, InAlAs, AlAsSb, or combinations thereof. In one or more embodiments, the CBM of the first and second layers 110, 111 may be II-IV semiconductor alloy, such as, for example, ZnSeTe, ZnCdTe, or combinations thereof. Additionally, the CBM of the first and second layers 110, 111 is lattice-matched or substantially lattice-matched to the III-V material of the channel region 106 by a suitable choice of CBM stoichiometry.

The first and second layers 110, 111 of CBM provided at the channel region 106 and/or at the extension regions 108, 109 of the hNS FET 100 of the present disclosure are configured to significantly increase mobility in the extension regions 108, 109 and the channel region 106 by suppressing surface roughness scattering (SRS), which would otherwise occur at an interface between the crystalline channel and a non-crystalline overlayer.

Reducing the thickness of the first and second layers 110, 111 of CBM at the channel region 106 compared to the extension regions 108, 109, or not providing the first and second layers 110, 111 of CBM in the channel region 106, is configured to increase electron mobility in the extension regions 108, 109 without increasing the equivalent oxide thickness (EOT) of the hNS FET 100, which would be detrimental to the short channel effects (SCE) performance of the hNS FET 100 and would not be a practical solution for the 5 nm node and beyond.

In one or more embodiments, the doping of the channel region 106 may be very low or intrinsic. Additionally, in one or more embodiments, the doping of the extension regions 108, 109 of the source and drain electrodes 101, 102 may be very low, such as, for example, having a doping density (e.g., an electron density) from approximately 1 e17/cm$^3$ to approximately 5 e18/cm$^3$. In one or more embodiments, the source and drain electrodes 101, 102 may be moderately doped, such as, for example, having a doping density from approximately 5 e18/cm$^3$ to approximately 1 e19/cm$^3$. Furthermore, in the illustrated embodiment, upper end portions 112, 113 of the source and drain electrodes 101, 102, respectively, are more heavily doped than remaining portions of the source and drain electrodes 101, 102 and the extension regions 108, 109. In one or more embodiments, the more heavily doped upper end portions 112, 113 of the source and drain electrodes 101, 102 may have a density from approximately 1 e19/cm$^3$ to approximately 1 e20/cm$^3$. Additionally, in one or more embodiments, the more heavily doped upper end portions 112, 113 may have a thickness from approximately 5 nm to approximately 10 nm. The more heavily doped upper end portions 112, 113 of the source and drain electrodes 101, 102 are configured to provide a good metal-semiconductor contact. Additionally, in the illustrated embodiment, the hNS FET 100 includes a pair of electrical contacts 114, 115 on the highly-doped upper end regions 112, 113, respectively, of the source and drain electrodes 101, 102.

In one or more embodiments, the effective length of the channel ($L_{eff}$) may be greater than the length of the gate ($L_G$). This may be achieved by placing the doping of the extension regions 108, 109 of the source and drain electrodes 101, 102 sufficiently away from inner edges of the extension regions 108, 109 that are proximate to the gate electrode 103. For example, in one or more embodiments, the relatively more heavily doped portions of the extension regions may be positioned at or proximate to sides of the first and second spacers 104, 105 that are located away from the gate electrode 103 (e.g., PN junctions may be located at sides of the first and second spacers 104, 105 that are located away from the gate electrode 103). In one or more embodiments, $L_{eff}$ may be greater than $L_G$ by approximately 4 nm to approximately 10 nm. In one embodiment, $L_{eff}$ may be greater than $L_G$ by approximately 4 nm, approximately 6 nm, approximately 10 nm, or more. Together, lightly doping the extension regions 108, 109 of the source and drain electrodes 101, 102 and providing the channel 106 with a greater effective length $L_{eff}$ than the length of the gate 106 are configured to reduce band-to-band tunneling (BTBT) leakage and the parasitic bipolar effect (PBE), which acts as an amplifier of the BTBT-induced leakage (i.e., lightly doping the extension regions 108, 109 and configuring the hNS FET 100 such that the effective length of the channel $L_{eff}$ is greater than the length of the gate $L_G$ are configured to reduce the parasitic leakage of the hNS FET 100). Additionally, as described above, the first and second layers 110, 111 of CBM at the extension regions 108, 109 of the source and drain electrodes 101, 102 are configured to increase electron mobility in the extension regions 108, 109 by suppressing SRS and this increased electron mobility is configured to prevent or substantially prevent an increase in parasitic resistance, which would otherwise occur due to the low doping (i.e., low electron density) in the extension regions 108, 109.

Although in the illustrated embodiment the hNS FET 100 includes a stack of two transistors, in one or more embodiments, the hNS FET 100 may include any other suitable number of transistors, such as, for instance, three or more transistors.

Figure 2:
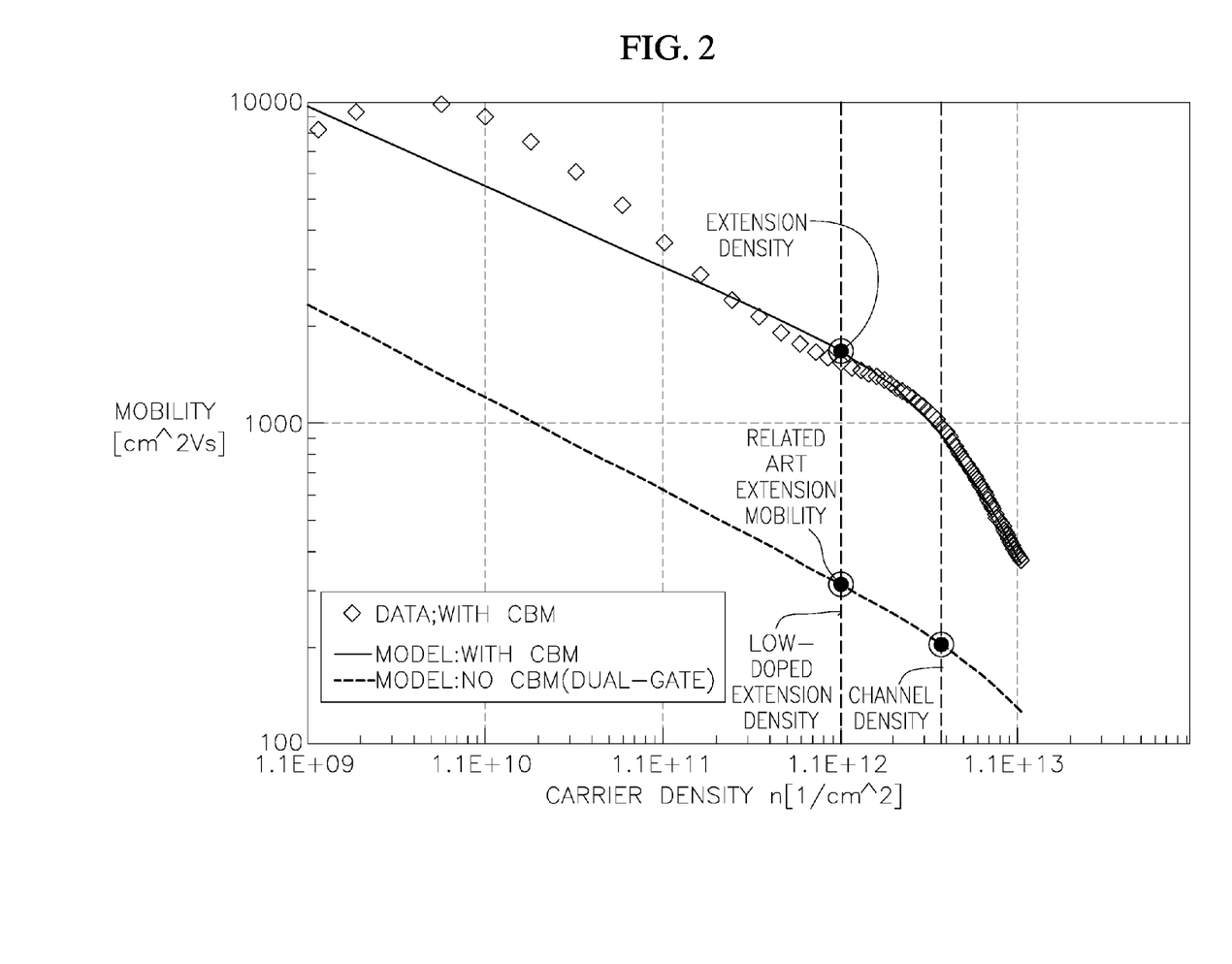
FIG. 2 is a graph comparing the carrier mobility of a hNS FET having one or more layers of crystalline barrier material according to one embodiment of the present disclosure to the carrier mobility of a conventional hNS FET.

FIG. 2 is a graph comparing the carrier mobility as a function of carrier density of the hNS FET 100 according to one embodiment of the present disclosure to a related art, comparative example hNS FET without any layers of CBM at the extension regions. FIG. 2 depicts both experimental data and the theoretical model of the hNS FET 100 having first and second layers 110, 111 of CBM at the extension regions 108, 109 of the source and drain electrodes 101, 102 but not at the channel region 106. As illustrated in FIG. 2, at a carrier density of approximately 1.10 E+12, which is the carrier density of the low-doped extension regions of the source and drain electrodes, the comparative example hNS FET has a carrier mobility of approximately 300 cm$^2$/Vs, whereas the hNS FET according to one embodiment of the present disclosure has a carrier mobility of approximately 2,000 cm$^2$/Vs. Additionally, as illustrated in FIG. 2, at a carrier density of approximately 4.10 E+12, which is the carrier density in the channel region, the comparative example hNS FET has a carrier mobility of approximately 200 cm$^2$/Vs, whereas the hNS FET according to one embodiment of the present disclosure has a carrier mobility of approximately 1,000 cm$^2$/Vs. Accordingly, the carrier mobility at the extension regions and the channel region of the hNS FET 100 according to one embodiment of the present disclosure is greater than the carrier mobility at the extension regions and the channel region of the related art, comparative example hNS FET that does not include any layers of CBM at the extension regions. Thus, the one or more layers of CBM at the extension regions of the source and drain electrodes are configured to increase carrier mobility compared to the related art, comparative example hNS FET that does not include any layers of CBM. In the related art, comparative example hNS FET, the extension regions and the channel region have relatively low mobility due to the high rate of surface roughness scattering (SRS) at an interface between the crystalline channel a non-crystalline overlayer. In contrast, the one or more layers of CBM provided at the channel region and/or at the extension regions of the hNS FET of the present disclosure are configured to significantly increase mobility in the extension regions and the channel region by suppressing SRS.

In one or more embodiments, the hNS FET 100 of the present disclosure may have a parasitic resistance ($R_{para}$) equal or substantially equal to the $R_{para}$ of related art hNS FETs, but the hNS FET 100 of the present disclosure may have significantly reduced parasitic leakage (e.g., approximately a 10 times reduction in band-to-band (BTBT) tunneling and an approximately 10 times reduction in the parasitic bipolar effect (PBE), for an approximately 100 times reduction in the overall parasitic leakage).

Figure 3A:
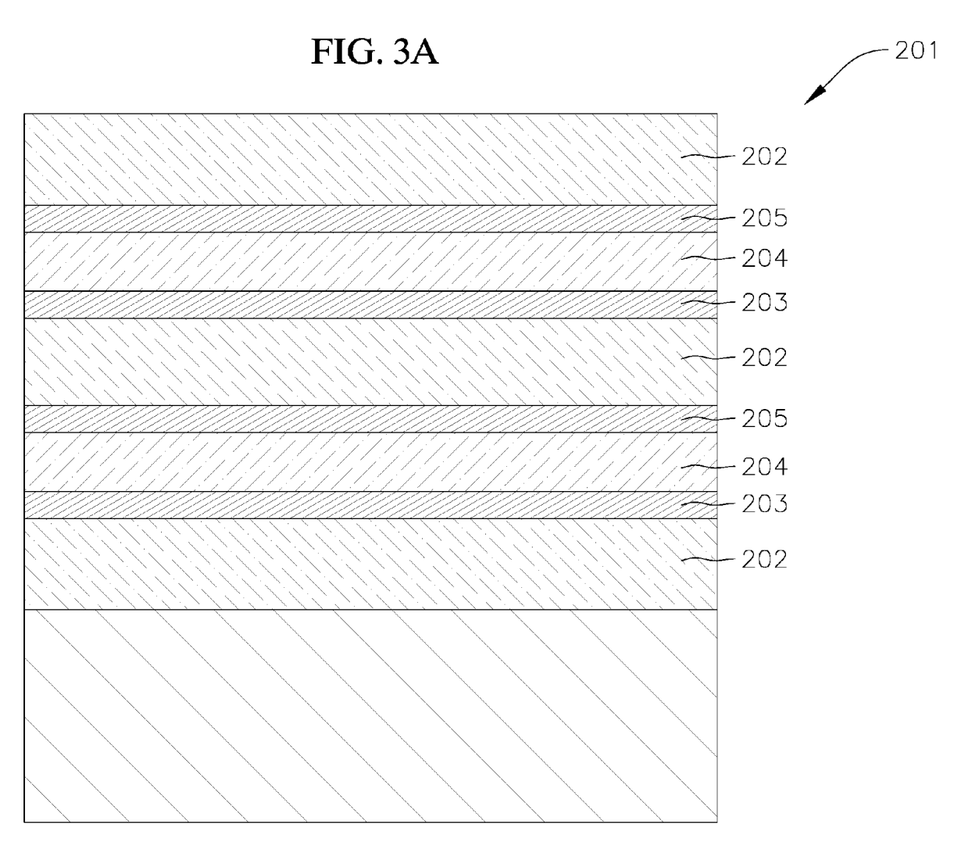
FIGS. 3A-3H depict tasks of a method of forming a hNS FET according to one embodiment of the present disclosure.

FIGS. 3A-3H depict tasks of a method of forming a horizontal nanosheet (hNS) field effect transistor (FET) 200 according to one embodiment of the present disclosure. As illustrated in FIG. 3A, the method of forming the hNS FET 200 according to one embodiment includes forming or obtaining an initial stack 201. In one or more embodiments, the initial stack 201 may be grown from a strain relaxation buffer (SRB). In one or more embodiments, the initial stack 201 may be transferred to an OI wafer using any suitable transfer process known in the art. In the illustrated embodiment, the initial stack 201 includes a sacrificial crystalline layer 202, a first layer 203 of crystalline barrier material (CBM) on the sacrificial crystalline layer 202, a channel layer 204 on the first layer 203 of CBM, and a second layer 205 of CBM on the channel layer 204. In the illustrated embodiment, the initial stack 200 also includes a repetition of these layers 202-205 on the second layer 205 of CBM. Although in the illustrated embodiment the initial stack 201 includes two channel layers 204, in one or more embodiments, the initial stack 201 may include any other suitable number of channel layers 204 depending on the desired size of the hNS FET 200. The channel layers 204 may be formed, for example, of $In_xGa_{1-x}As$ or $In_xGa_{1-x}Sb$. The CBM of the first and second layers 203, 205 may be InP, InGaP, InAlAs, AlAsSb, or combinations thereof. In one or more embodiments, the CBM of the first and second layers 203, 205 may be II-IV semiconductor alloy, such as, for example, ZnSeTe, ZnCdTe, or combinations thereof. Additionally, the CBM of the first and second layers 203, 205 is lattice-matched to the channel layer 204 by a suitable choice of CBM stoichiometry. The layers 203, 205 of CBM may each have a thickness from approximately 0.5 nm to approximately 5 nm, such as, for instance, from approximately 1 nm to approximately 3 nm. In one or more embodiments, each of the sacrificial crystalline layers 202 may have any suitable thickness depending on the desired vertical separation between adjacent channel layers 204, such as, for instance, from approximately 4 nm to approximately 15 nm. Additionally, in one embodiment, the lowest sacrificial crystalline layer 202 of the initial stack 201 may be formed on any suitable isolation known in the art.

Additionally, although in the illustrated embodiment the stack includes first and second layers 203, 205 of CBM above and below each respective channel layer 204, in one or more embodiments, the initial stack 201 may include a single layer of CBM for each channel layer 204 depending on the desired configuration of the one or more layers of CBM in the hNS FET 200 (e.g., the initial stack 201 may include a single layer of CBM above or below each channel layer 204). In one or more embodiments, the task of forming the initial stack 201 may be the same or similar to the tasks of forming a stack for a related art III-V hNS, but with the addition of the one or more layers 203, 205 of CBM for each channel layer 204.

Figure 3B:
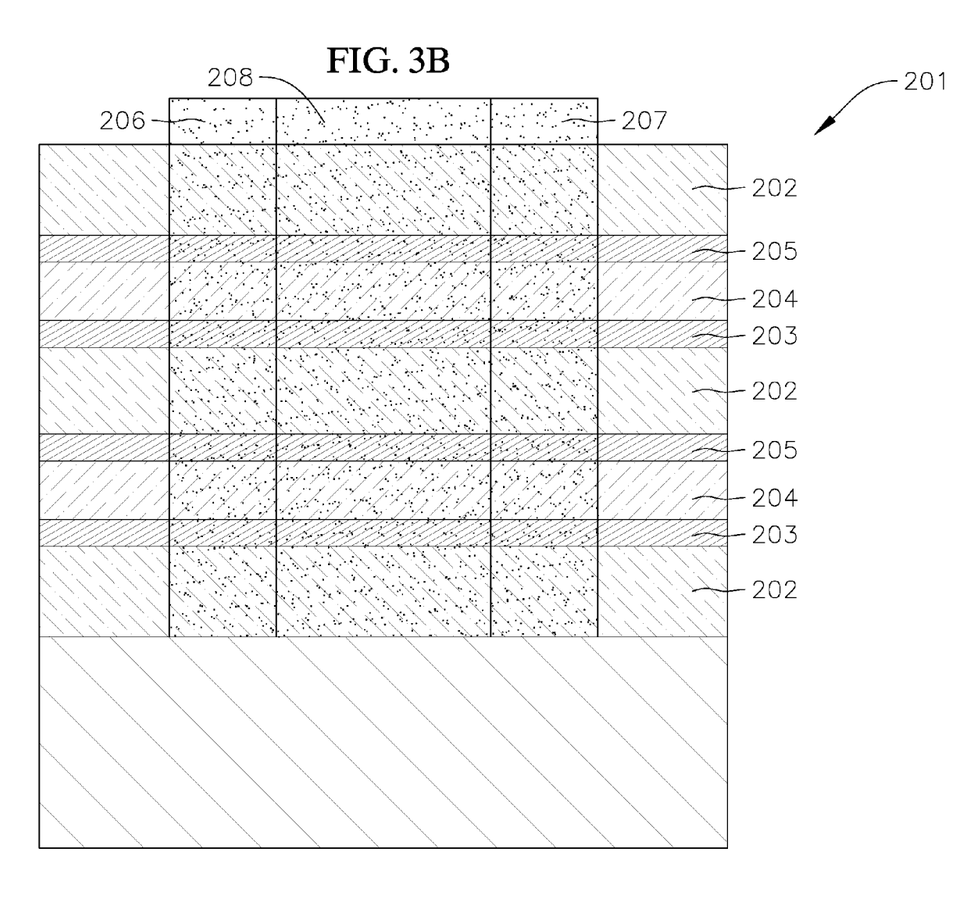

With reference now to FIG. 3B, the method of forming the hNS FET 200 according to one embodiment of the present disclosure also includes a task of forming a pair of spacers 206, 207 and a sacrificial poly gate 208 in the initial stack 201 (i.e., forming a pair of spacers 206, 207 and a sacrificial poly gate 208 that extend down through the lowest sacrificial crystalline layer 202). The pair of spacers 206, 207 and the sacrificial poly gate 208 may be formed by any suitable manufacturing techniques or processes known in the art or hereinafter developed.

Figure 3C:
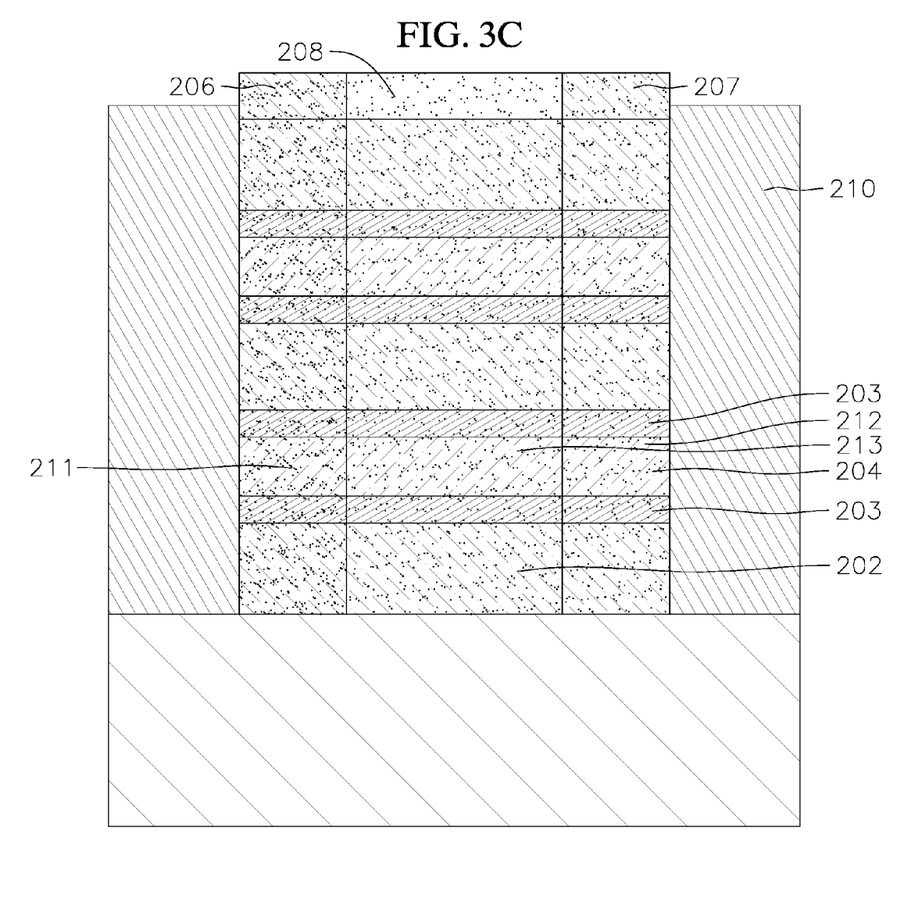

With reference now to FIG. 3C, the method of forming the hNS FET 200 according to one embodiment of the present disclosure also includes a task of etching to remove portions of the sacrificial crystalline layers 202, the channel layers 204, and the layers 203, 205 of CBM that are outside of the pair of spacers 206, 207 and the sacrificial poly layer 208 (i.e., etching to remove portions of the initial stack 201 that are outside of the pair of spacers 206, 207). In the illustrated embodiment, the method also includes a task of epitaxially re-growing source and drain electrodes 209, 210 outside of the pair of spacers 206, 207. The source and drain electrodes 209, 210 formed during the epitaxial re-growth are seeded by the channel layers 204 and the layers 203, 205 of CBM. In one or more embodiments, the source and drain electrodes 209, 210 formed during the epitaxial re-growth may be lightly in-situ doped or undoped. For example, in one or more embodiments, the source and drain electrodes 209, 210 may have a doping density from approximately 5 e18/cm$^3$ to approximately 1 e19/cm$^3$. Additionally, the method may include a task of forming internal spacers (not shown) by any suitable method known in the art or hereinafter developed. Following the task of etching to remove portions of the initial stack 201 that are outside of the pair of spacers 206, 207 and epitaxially re-growing the source and drain electrodes 209, 210, the source and drain electrodes 209, 210 include extension regions 211, 212, respectively, extending at least partially under the spacers 206, 207, respectively, and the portions of the channel layers 204 extending between the spacers 206, 207 define channel regions 213. Additionally, in one or more embodiments, the extension regions 211, 212 of the source and drain electrodes 209, 210 may be lightly doped, such as having a doping density of approximately 5 e18/cm$^3$ to 1 e17/cm$^3$. The doping of the extension regions 211, 212 may be from in-diffusion from adjacent regions of the epitaxially re-grown source and drain electrodes 209, 210 and/or from in-diffusion from the layers 203, 205 of CBM. In one or more embodiments, the doping of the extension regions 211, 212 due to in-diffusion from adjacent regions of the epitaxially re-grown source and drain electrodes 209, 210 may be limited by any suitable technique, such as using dopant diffusion inhibitors and/or by forming the epitaxially re-grown source and drain electrodes 209, 210 such that the source and drain electrodes 209, 210 are substantially lightly doped or undoped.

Figure 3D:
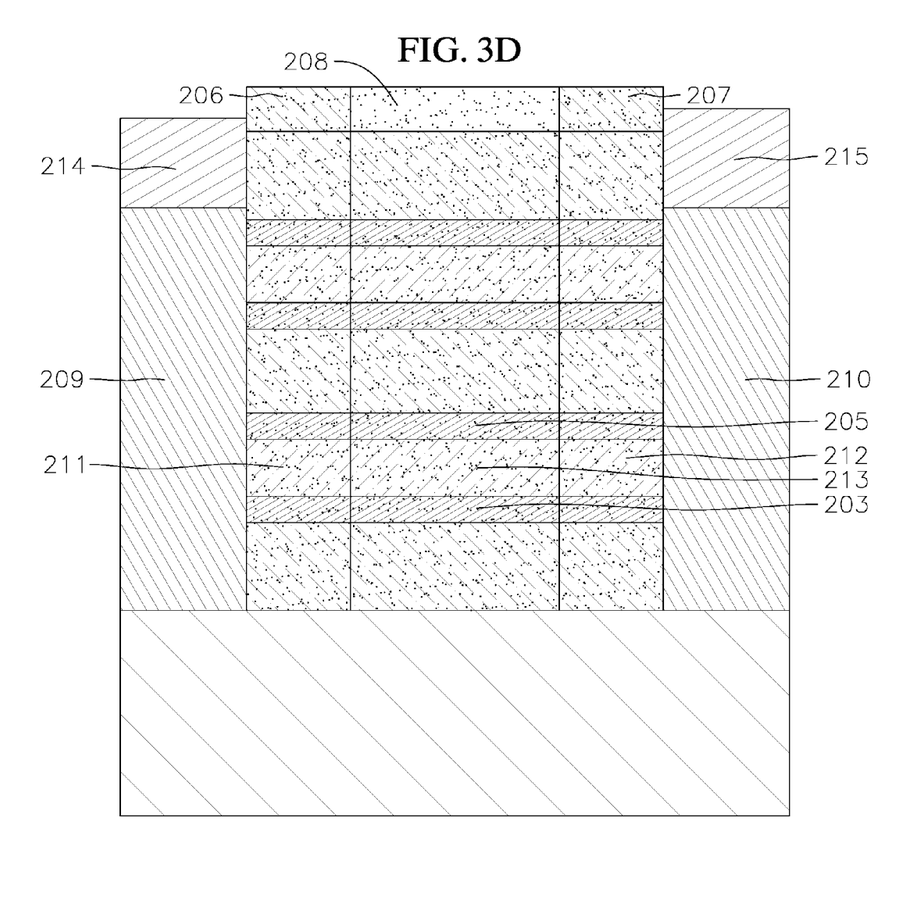

With reference now to FIG. 3D, the method of forming the hNS FET 200 according to one embodiment of the present disclosure includes a task of ultra-shallow doping upper end portions 214, 215 of the source and drain electrodes 209, 210, respectively. The upper end portions 214, 215 of the source and drain electrodes 209, 210 that are doped may have a thickness (i.e., a depth) from approximately 5 nm to approximately 10 nm. In one or more embodiments, the upper end portions 214, 215 of the source and drain electrodes 209, 210 may be doped to have a doping density from approximately 1 e19/cm$^3$ to approximately 1 e20/cm$^3$. The upper end portions 214, 215 of the source and drain electrodes 209, 210 that are relatively heavily doped may be used to enable low contact resistivity with subsequently formed contacts (e.g., low resistance between the source and drain electrodes 209, 210 and subsequently formed contacts on the upper end portions 214, 215). The upper end portions 214, 215 may be doped by any suitable technique or process, such as plasma implantation. Additionally, in one or more embodiments, the task of ultra-shallow doping of the upper end portions 214, 215 of the source and drain electrodes 209, 210 may include a task of activation annealing the upper end portions 214, 215.

Figure 3E:
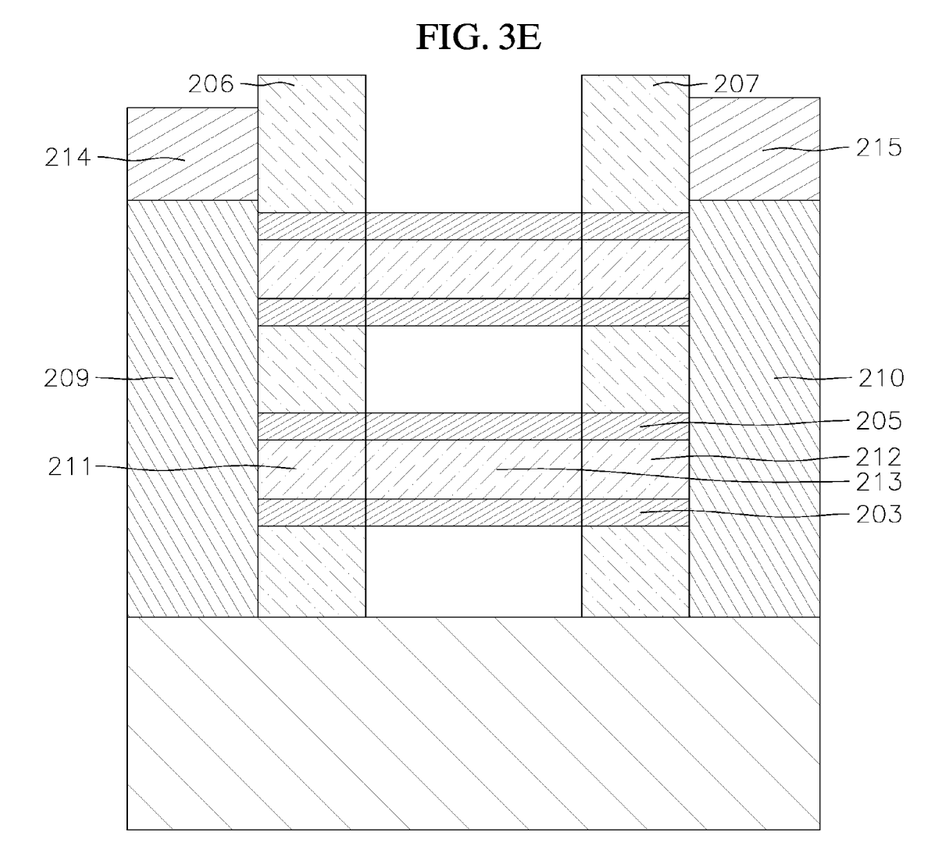

With reference now to FIG. 3E, the method of forming the hNS FET 200 according to one embodiment of the present disclosure includes a task of selectively etching the sacrificial poly gate 208 and the remainder of each of the sacrificial crystalline layers 202 (i.e., the method includes removing the sacrificial poly gate 208 and the remainder of each of the sacrificial crystalline layers 202 by selective etching). The task of selectively etching the sacrificial poly gate 208 and the sacrificial crystalline layers 202 does not affect the layers 203, 205 of CBM or the internal spacers. Accordingly, following the task of selectively etching the sacrificial poly gate 208 and the sacrificial crystalline layers 202, the layers 203, 205 of CBM and the internal spacers remain intact. In one or more embodiments, the material of the sacrificial crystalline layers 202 may be sufficiently different than the material of the channel region 213 to enable high-selectivity etching of the sacrificial crystalline layers 202 but not the channel region 213 (e.g., the sacrificial crystalline layers 202 may be formed of $In_yGa_{1-y}As$ or $In_yGa_{1-y}Sb$ and the channel regions 213 may be formed of $In_xGa_{1-x}As$ or $In_xGa_{1-x}Sb$, where the composition parameter "y" is sufficiently different from the composition parameter "x" to enable selective etching of the sacrificial crystalline layers 202 but not the channel regions 213). In one or more embodiments, the sacrificial crystalline layers 202 may be formed of InP, InGaP, InAlAs, or AlAsSb, where the material is chosen to be selectively etchable relative to both the layers 203, 205 of CBM and the channel regions 213.

Figure 3F:
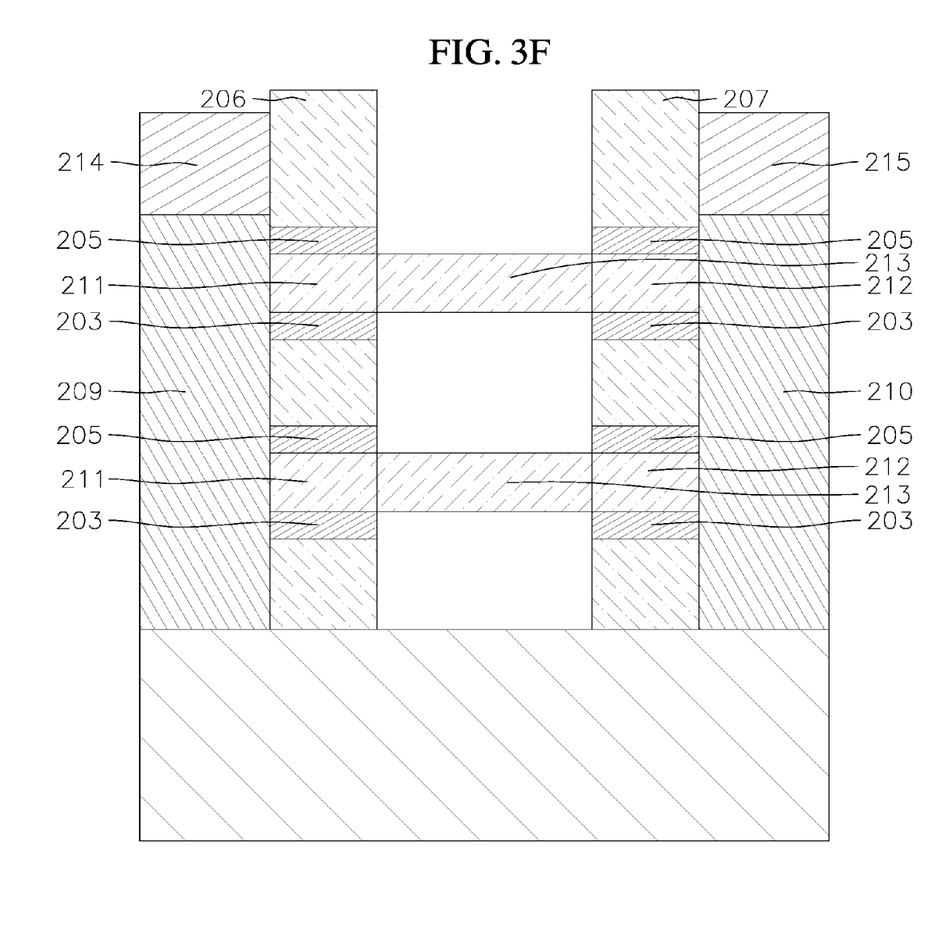

With reference now to FIG. 3F, the method of forming the hNS FET 200 according to one embodiment of the present disclosure includes a task of performing a timed selective etch to completely remove portions of the layers 203, 205 of CBM between the spacers 206, 207 (i.e., completely removing portions of the layers 203, 205 of CBM above and below the channel regions 213). In one or more embodiments, the task of performing the timed selective etch may remove a small portion of each of the layers 203, 205 of CBM underneath the spacers 206, 207 (e.g., the timed selective etch may remove approximately 2 nm of the inwardly-facing portion of each layer 203, 205 of CBM underneath the spacers 206, 207). Following the task of performing the timed selective etch, all or substantially all of the portions of the layers 203, 205 of CBM at the extension regions 211, 212 of the source and drain electrodes 209, 210 underneath the spacers 206, 207, respectively, remain intact. In one or more embodiments, the task of performing a timed selective etch may be performed to reduce the thickness of the layers 203, 205 of CBM at the channel regions 213, but not completely remove the portions of the layers 203, 205 of CBM at the channel regions 213. For example, in one or more embodiments in which the layers 203, 205 of CBM in the initial stack 201 each have a thickness from approximately 3 nm to approximately 5 nm, the timed selective etch may be performed to reduce the thickness of the portions of the layers 203, 205 of CBM at the channel regions 213 to approximately 1 nm to approximately 2 nm while maintaining the thickness of the portions of the layer 203, 205 of CBM at the extension regions 211, 212 at the initial thickness of approximately 3 nm to approximately 5 nm.

Figure 3G:
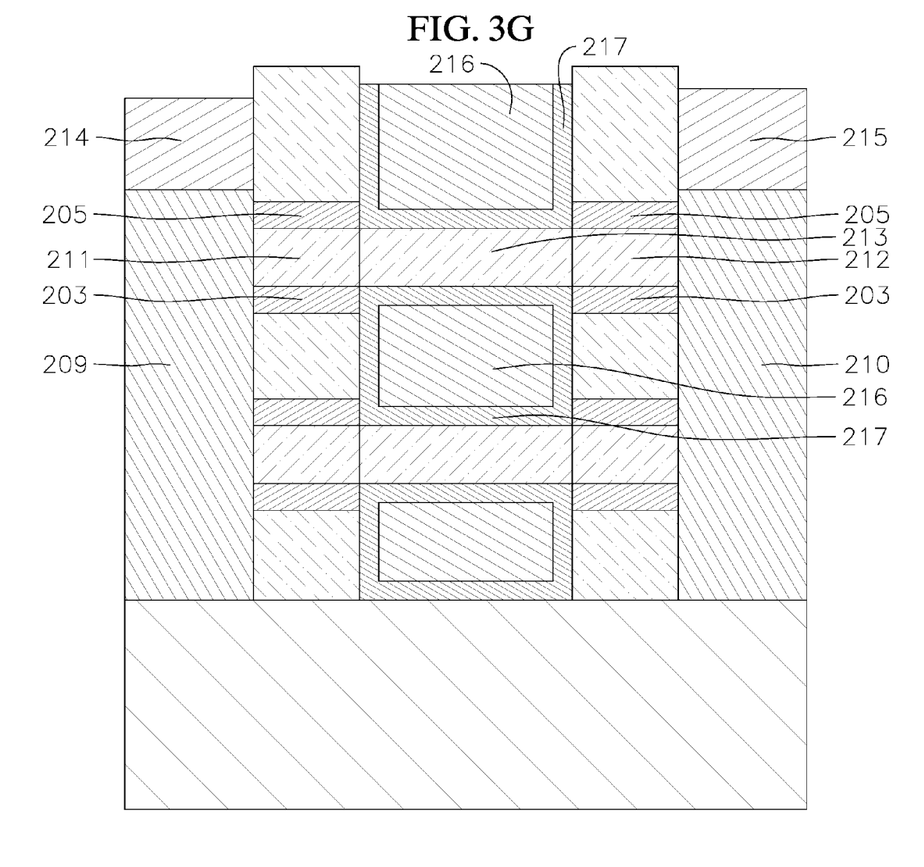
Figure 3H:
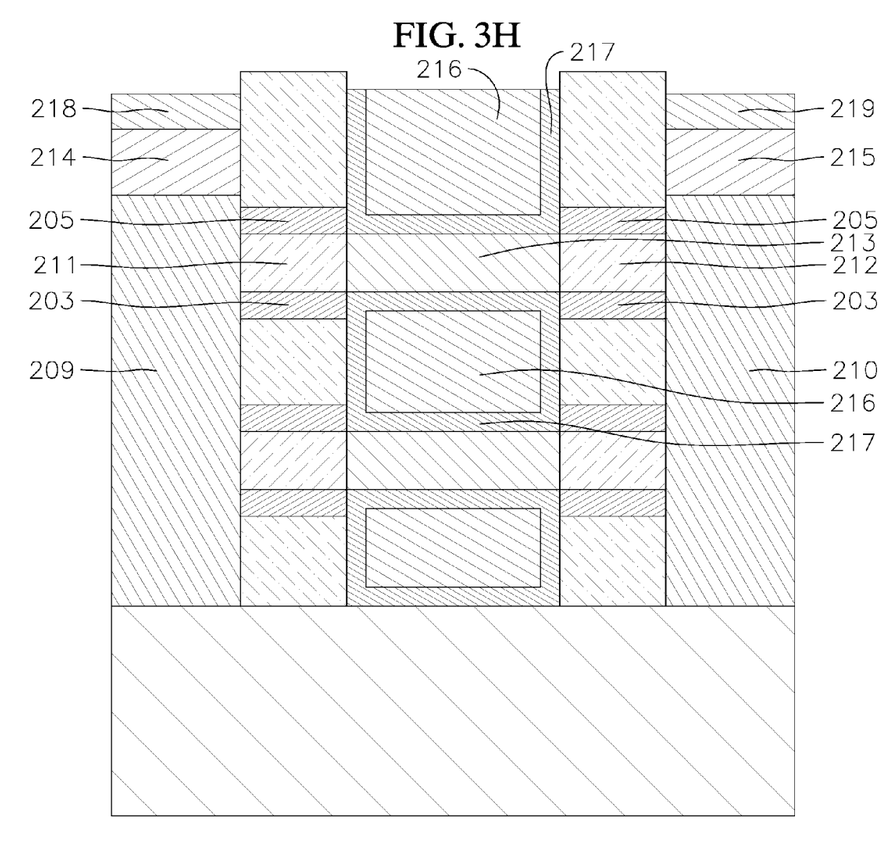

With reference now to FIG. 3G, the method of forming the hNS FET 200 according to one embodiment of the present disclosure also includes a task of forming or depositing a metal gate electrode 216 and an interfacial layer (IL) 217 (e.g., a Hi-k gate oxide layer) for each channel region 213. The metal gate electrodes 216 and the ILs 217 are deposited in regions that were previously occupied by portions of the sacrificial crystalline layers 202 and the layers 203, 205 of CBM extending between the spacers 206, 207 (i.e., the metal gate electrodes 216 and the ILs 217 are deposited in cavities that were formed during the tasks of etching the sacrificial crystalline layers 202 and the layers 203, 205 of CBM, as illustrated in FIGS. 3E and 3F). The task of forming or depositing the gate electrodes 216 and the ILs 217 may be performed with any suitable manufacturing process or technique known in the art or hereinafter developed. Although in the illustrated embodiment, method includes depositing or forming three gate electrodes 216 and three corresponding ILs 217, in one or more embodiments, the method may include forming or depositing any other suitable number of gate electrodes and ILs depending on the desired size of the hNS FET 200. With reference now to FIG. 3H, the method of forming the hNS FET 200 according to one embodiment of the present disclosure also includes a task of forming electrical contacts 218, 219 on the highly-doped upper end portions 214, 215 of the source and drain electrodes 209, 210, respectively, to complete the hNS FET 200.

In one or more embodiments, the source and drain electrodes 209, 210 may be formed of a different material than the extension regions 211, 212 and/or the channel region 213 depending on the requirements of the metal-semiconductor contact. For example, in one embodiment in which the channel region 213 is formed of $In_xGa_{1-x}As$, the source and drain electrodes 209, 210 may be formed of $In_yGa_{1-y}As$, where y<x. In one or more embodiments, the source and drain electrodes 209, 210 may be formed of InAs.

The tasks described above for forming the hNS FET may be performed in the order described or in any other suitable sequence. Additionally, the method described above is not limited to the tasks described. Instead, one or more of the tasks described above may be absent and/or one or more additional tasks may be performed.

A method of forming a horizontal sheet (hNS) field effect transistor (FET) according to another embodiment of the present disclosure includes forming or obtaining a standard hNS stack including an alternating arrangement of sacrificial crystalline layers and channel layers. Unlike the initial stack described above according to the method depicted in FIGS. 3A-3H, the initial stack according this embodiment does not include layers of crystalline barrier material (CBM). The method also includes a task of etching the initial stack to form regions for depositing internal spacers. The method also includes a task of forming one or more layers of CBM at extension regions of the source and drain electrodes. The one or more layers of CBM may be formed by epitaxially re-growing the layers of CBM in the extension regions of the source and drain electrodes. The method further includes a task of depositing the internal spacers after the task of epitaxially re-growing the layers of CBM in the extension regions of the source and drain electrodes.

What is claimed is:
1. A horizontal nanosheet field effect transistor, comprising:
 a source electrode;
 a drain electrode;
 a gate electrode between the source electrode and the drain electrode;
 a first spacer separating the source electrode from the gate electrode;
 a second spacer separating the drain electrode from the gate electrode;

a channel region under the gate electrode, the channel region extending between the source electrode and the drain electrode;

the source electrode and the drain electrode each comprising an extension region, the extension region of the source electrode being under at least a portion of the first spacer and the extension region of the drain electrode being under at least a portion of the second spacer; and at least one layer of crystalline barrier material, wherein the at least one layer has a first thickness at the extension regions of the source and drain electrodes and a second thickness less than the first thickness at the channel region.

2. The horizontal nanosheet field effect transistor of claim 1, wherein the first thickness of the at least one layer of crystalline barrier material at the extension regions of the source and drain electrodes is from approximately 3 nm to approximately 5 nm and the second thickness of the at least one layer of crystalline barrier material at the channel region is from approximately 1 nm to approximately 2 nm.

3. The horizontal nanosheet field effect transistor of claim 1, wherein the first thickness of the at least one layer of crystalline barrier material at the extension regions of the source and drain electrodes is from approximately 0.5 nm to approximately 5 nm and the second thickness of the at least one layer of crystalline barrier material at the channel region is substantially zero.

4. The horizontal nanosheet field effect transistor of claim 1, wherein the at least one layer comprises a first layer of crystalline barrier material above the extension regions of the source and drain electrodes and a second layer of crystalline barrier material below the extension regions of the source and drain electrodes.

5. The horizontal nanosheet field effect transistor of claim 1, wherein the crystalline barrier material is selected from the group of materials consisting of InP, InGaP, InAlA, AlAsSb, and combinations thereof.

6. The horizontal nanosheet field effect transistor of claim 1, wherein the crystalline barrier material comprises a II-IV semiconductor alloy.

7. The horizontal nanosheet field effect transistor of claim 6, wherein the II-IV semiconductor alloy is ZnSeTe or ZnCdTe.

8. The horizontal nanosheet field effect transistor of claim 1, wherein upper portions of the source and drain electrodes are more heavily doped than remaining portions of the source and drain electrodes.

9. The horizontal nanosheet field effect transistor of claim 8, wherein the more heavily doped upper portions of the source and drain electrodes each have a thickness from approximately 5 nm to approximately 10 nm.

10. The horizontal nanosheet field effect transistor of claim 1, wherein the channel comprises a III-V material.

11. The horizontal nanosheet field effect transistor of claim 1, wherein the extension regions of the source and drain electrodes are lightly doped having a doping density from approximately 5 e18/cm$^3$ to 1 e17/cm$^3$.

12. The horizontal nanosheet field effect transistor of claim 1, wherein an effective length of the channel region is greater than a length of the gate electrode.

13. The horizontal nanosheet field effect transistor of claim 12, wherein the effective length of the channel region is greater than the length of the gate electrode by at least approximately 4 nm.

* * * * *